United States Patent
Suzuki et al.

(10) Patent No.: US 6,546,273 B2
(45) Date of Patent: Apr. 8, 2003

(54) MR FLUOROSCOPY METHOD AND APPARATUS

(75) Inventors: Katsunori Suzuki, Kashiwa (JP); Shigeru Sato, Kita-soma-gun (JP)

(73) Assignee: Hitachi Medical Corporation, Tokyo (JP)

( * ) Notice: Subject to any disclaimer, the term of this patent is extended or adjusted under 35 U.S.C. 154(b) by 0 days.

(21) Appl. No.: 09/814,804

(22) Filed: Mar. 23, 2001

(65) Prior Publication Data

US 2001/0018558 A1 Aug. 30, 2001

Related U.S. Application Data

(63) Continuation of application No. 09/119,059, filed on Jul. 20, 1998.

(30) Foreign Application Priority Data

Jul. 22, 1997 (JP) .............................................. 9-195466

(51) Int. Cl.$^7$ ................................................. A61B 5/05
(52) U.S. Cl. ....................... 600/410; 600/411; 324/307; 324/309; 324/312; 324/322
(58) Field of Search ................................ 600/410, 411; 324/307, 304, 312, 322

(56) References Cited

U.S. PATENT DOCUMENTS

| | | | | |
|---|---|---|---|---|
| 4,707,658 A | * | 11/1987 | Frahm et al. ................ | 324/309 |
| 4,949,042 A | * | 8/1990 | Kuhara et al. ............... | 324/311 |
| 5,078,141 A | * | 1/1992 | Suzuki et al. ............. | 128/653.2 |
| 5,166,875 A | * | 11/1992 | Machida ................. | 364/413.13 |
| 5,184,073 A | | 2/1993 | Takeuchi et al. | |
| 5,245,282 A | * | 9/1993 | Mugler, III et al. ........ | 324/300 |
| 5,275,164 A | * | 1/1994 | Maeda et al. ............. | 128/653.2 |
| 5,501,218 A | * | 3/1996 | Usui ........................ | 128/653.2 |
| 5,512,827 A | * | 4/1996 | Hardy et al. ................. | 324/309 |
| 5,578,924 A | | 11/1996 | Dumoulin et al. | |
| 5,631,560 A | * | 5/1997 | Machida ..................... | 324/309 |
| 5,722,410 A | * | 3/1998 | NessAiver ............... | 128/653.2 |
| 5,755,665 A | | 5/1998 | Takahashi et al. | |
| 5,810,726 A | * | 9/1998 | Van Vaals et al. .......... | 600/410 |

FOREIGN PATENT DOCUMENTS

JP          A-8-238229          9/1996

* cited by examiner

*Primary Examiner*—Marvin M. Lateef
*Assistant Examiner*—Jeoyuh Lin
(74) *Attorney, Agent, or Firm*—Oliff & Berridge, PLC

(57) ABSTRACT

Imaging and image reconstruction are sequentially performed for slices of a subject, and realtime images of the slices are displayed substantially at the same time. The slices may be perpendicular or parallel to one another, or they may form a stereoscopic pair. The images may be displayed two-dimensionally, or they may be combined and displayed three-dimensionally. One of the slices includes an insertion (a needle) for puncture or biopsy that is inserted into the subject by an operator, and it is parallel with a direction in which the insertion should advance. If the needle is displaced from the slice and a shade of the needle disappears from the sequentially-displayed images of the slice while the operator moves the needle toward an affected part in the subject in IVR, the shade of the needle appears on the sequentially-displayed images of another slice that is perpendicularly intersecting to or is adjacent and parallel to the above-mentioned slice. Hence, the operator can always determine the position and advancing direction of the needle.

12 Claims, 10 Drawing Sheets

MR FLUOROSCOPY METHOD AND APPARATUS

This is a continuation of application Ser. No. 09/119,059 filed Jul. 20, 1998.

BACKGROUND OF THE INVENTION

1. Field of the Invention

The present invention relates generally to a magnetic resonance (MR) imaging system, which employs nuclear magnetic resonance to display desired sectional images of the subject, and more particularly to an MR imaging system for use with MR fluoroscopy wherein high-rate imaging, reconstruction and display are sequentially performed to display realtime images sequentially.

2. Description of Related Art

An MR imaging system measures the distribution of intensity and relaxation time of nuclear spins at a desired examined part of the subject by employing nuclear magnetic resonance, and displays desired sectional images of the subject in accordance with the measurement data.

A publication "MR Fluoroscopy: Technical Feasibility" (by S. J. Riederer, T. Tasciyan, F. Farzaneh, J. N. Lee, R. C. Wright, R. J. Herfkens, Magnetic Resonance in Medicine 8, 1988, pp. 1–15) introduced MR fluoroscopy as an imaging method using the MR imaging system. In the MR fluoroscopy, high-rate imaging, reconstruction and display are performed sequentially, periodically and continuously for a slice of the subject, and realtime images of the slice are displayed. The image reconstructing time for the slice is substantially adjusted to the imaging time for the slice so that the images of the slice can be displayed in realtime. The MR fluoroscopy is used to monitor and control interventional radiology (IVR), wherein the operator practices thermotherapy, examines, and/or treats the subject while performing the MR imaging to the subject. In the case of the IVR, the MR fluoroscopy enables the operator to determine the position and advancing direction of an insertion (e.g. a needle for puncture or biopsy, and a catheter) in realtime while the operator moves the needle towards a target (e.g. an affected part) in the subject. The puncture is usually performed in biopsy, injection and laser surgery for the affected part.

In the conventional MR fluoroscopy, however, only a specific slice is imaged. Hence, if the needle is displaced from the specific slice while the operator moves the needle toward the target in the subject, the shade of the needle disappears from the displayed image of the slice. This makes it impossible for the operator to determine the position and advancing direction of the needle.

SUMMARY OF THE INVENTION

Accordingly, it is an object of the present invention to provide an MR imaging system that always enables the operator to correctly determine the position and advancing direction of the insertion.

To achieve the above object, the present invention is directed to an MR imaging system comprising: a static magnetic field generator for generating a static magnetic field; a magnetic field generator for applying a radio frequency magnetic field and a gradient magnetic field to a subject placed within the static magnetic field; a signal detector for sequentially detecting nuclear magnetic resonance signals produced from a plurality of slices of the subject; a signal processor for sequentially reconstructing a plurality of images of the slices from the detected nuclear magnetic resonance signals; and an image display system for showing the plurality of reconstructed images.

One of the slices may include an insertion that is inserted into the subject, and it may be parallel with a direction in which the insertion should advance.

The slices may be parallel or perpendicular to each other, and they may intersect each other at such an angle as to form a stereoscopic image so that they form a stereoscopic pair.

A pulse sequence for imaging (an imaging pulse sequence) is not particularly restricted if signals required for reconstructing one image can be detected within a short period of time like a gradient echo method and an echo planer method. The signal detection time is controlled by adjusting the number of phase encoding and a repetition time TR.

A multi-slice imaging may be employed to reconstruct images of slices. In the multi-slice imaging, the excitation and the signal detection for slices are sequentially performed within a repetition time, and this is repeated a plurality to acquire signal required for reconstructing respective images of the slices. It is also possible to reconstruct images of slices by repeating a single-slice imaging, which performs the excitation, signal detection and image reconstruction for a single slice, a plurality.

According to the present invention, not only one sectional image but an image of a slice that intersects the sectional image or is parallel thereto in the vicinity thereof are reconstructed and displayed substantially at the same time. If the insertion is displaced from one slice and a shade of the insertion disappears from the sequentially-displayed image of the slice while the operator moves the insertion towards an affected part in the subject, the shade of the insertion appears on the image of another slice that intersects the sectional image or is parallel thereto in the vicinity thereof. Hence, the operator can always determine the position and advancing direction of the insertion, and can perform the IVR easily and accurately.

Particularly since a stereoscopic image is constructed by images of two slices that intersect one another at a predetermined angle, or images of slices are combined and displayed three-dimensionally, the position and advancing direction of the insertion can be displayed more clearly.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein.

DETAILED DESCRIPTION OF THE PREFERRED EMBODIMENT

This invention will be described in further detail by way of example with reference to the accompanying drawings.

Figure 1:
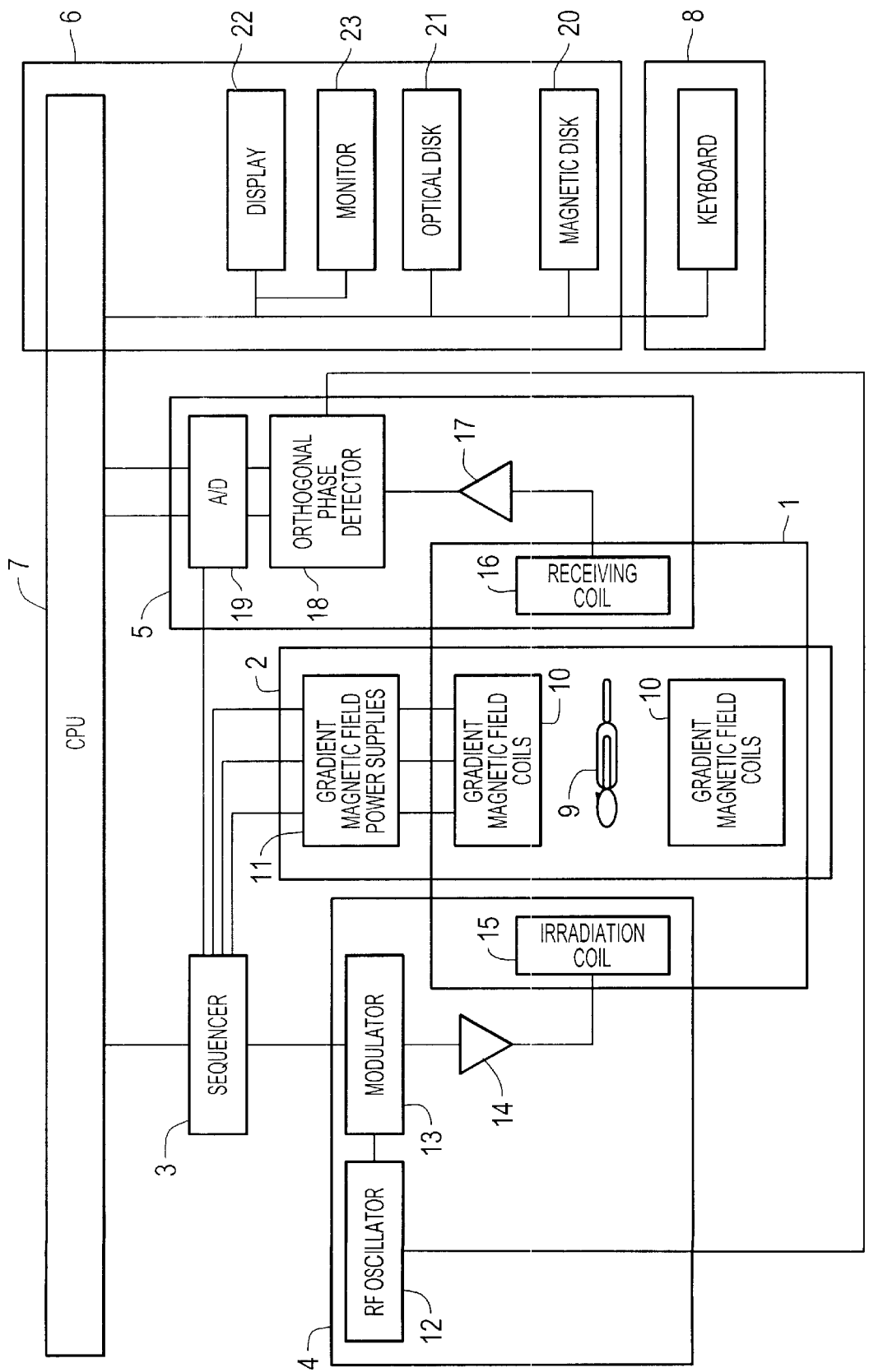
FIG. 1 is a block diagram of the entire structure of the MR imaging system according to the present invention.

FIG. 1 is a block diagram of the major components of a magnetic resonance (MR) imaging system for use with MR fluoroscopy of the present invention.

The MR imaging system measures the distribution of intensity and relaxation time of nuclear spins (hereinafter referred to as "spins") at a desired examined part of the subject by employing nuclear magnetic resonance, and displays MR images of desired cross-sections of the subject in accordance with the measurement data. The MR imaging system comprises a static magnetic field generator 1, a gradient magnetic field generator 2, a sequencer 3, a transmitter 4, a receiver 5, a signal processor 6, a central processing unit (CPU) 7, and a controlled unit 8.

The static magnetic field generator 1 is a magnetic field generator of a permanent magnet system, a normal conduction system or a superconduction system, and it generates a uniform static magnetic field around a subject 9 in a direction parallel or perpendicular to the subject's axis.

The gradient magnetic field generator 2 comprises gradient magnetic field coils 10 that vary the intensity of the magnetic field along three axes X, Y and Z, and gradient magnetic field power supplies 11 that drive the respective coils. The gradient magnetic field generator 2 drives the gradient magnetic field power supplies 11 of respective coils in accordance with instructions from the sequencer 3 to apply gradient magnetic fields Gs (a slice direction gradient magnetic field), Gp (a phase encoding gradient magnetic field) and Gf (a frequency encoding gradient magnetic field) to the subject 9. It is possible to set the position and direction of an imaged slice with respect to the subject 9, depending on how the gradient magnetic fields are applied.

The sequencer 3 is a control means which repeatedly applies the gradient magnetic fields, and radio frequency (RF) pulses, which excite the nuclei of hydrogen atoms or other specific atoms of the subject 9 for the nuclear magnetic resonance, to the subject 9 so as to acquire the measurement data. The sequencer 3 is operated under the control of the CPU 7, and it transmits a variety of instructions necessary for acquiring data on the reconstruction of tomographic images of the subject 9 to the transmitter 4, the gradient magnetic field generator 2 and the receiver 5.

The transmitter 4 consists of an RF oscillator 12, a modulator 13, an RF amplifier 14 and an RF coil 15. In accordance with the instructions from the sequencer 3, the transmitter 4 applies electromagnetic wave to the subject 9 to excite the nuclei and detect an MR response signal from the subject 9. Specifically, the RF oscillator 12 outputs the RF pulse, and the modulator 13 modulates the amplitude of the RF pulse in accordance with pulse envelopes from the sequencer 3. The RF amplifier 14 amplifies the modulated RF pulse, and the RF coil 15, which is arranged in proximity to the subject 9, converts the RF pulse into the electromagnetic wave and applies it to the subject 9.

The receiver 5 consists of a receiving coil 16, an amplifier 17, an orthogonal phase detector 18 and an A/D converter 19, and the receiver 5 detects an echo signal (NMR signal) emitted from the nuclei of hydrogen atoms or other specific atoms of the subject 9, which is excited by the RF pulse, due to the magnetic resonance. Specifically, the receiving coil 16 is arranged in proximity to the subject 9, and it detects an MR response electromagnetic wave (the NMR signal) from the subject 9 which is excited by the electromagnetic wave applied from the coil 15. The amplifier 17 amplifies the detected signal, and the orthogonal phase detector 18 converts the signal into two series of collected data. Then the A/D converter 19 digitizes the data and transmits it to the signal processor 6.

The signal processor 6 consists of the CPU 7, recording devices such as a magnetic disk 20 and an optical disk 21, and a display 22 such as a CRT. The signal processor 6 performs data processing such as Fourier transformation, calculation of correction coefficients and image reconstruction, and performs a suitable calculation with respect to the distribution of intensity and relaxation time of the spins for a desired slice of the subject 9. Then, the signal processor 6 transforms the obtained distribution into an image, and displays it as a tomographic image of the subject 9 on the display 22.

The controlled unit 8 is provided with a keyboard, and enables the operator to enter control information on the processing performed by the signal processor 6.

In the MR imaging system, the gradient magnetic field coils 10 and the RF coil 15 are incorporated in a space of the static magnetic field where the subject 9 is placed. In the MR imaging system, the space is preferably open at least partially so that the operator can manipulate an insertion (an IVR means) such as a catheter and a needle for puncture or biopsy in close proximity to the subject 9; in other words, the MR imaging system is preferably the open gantry type.

A liquid crystal display (LCD) 23 is arranged in the vicinity of the space where the subject 9 is placed, so that the operator can monitor the IVR means on the LCD 23. An image on the LCD 23 will not be warped due to the influence of the magnetic field, and the LCD 23 is compact. For these reasons, the LCD 23 is an ideal display to be placed close to the subject 9. As is the case with the display 22, the realtime tomographic images of the subject 9 can be shown on the LCD 23. Thus, the operator can monitor the tomographic images in proximity to the subject 9.

A description will be given of the MR fluoroscopy with use of the MR imaging system, which is constructed in the above-mentioned manner.

Figure 2:
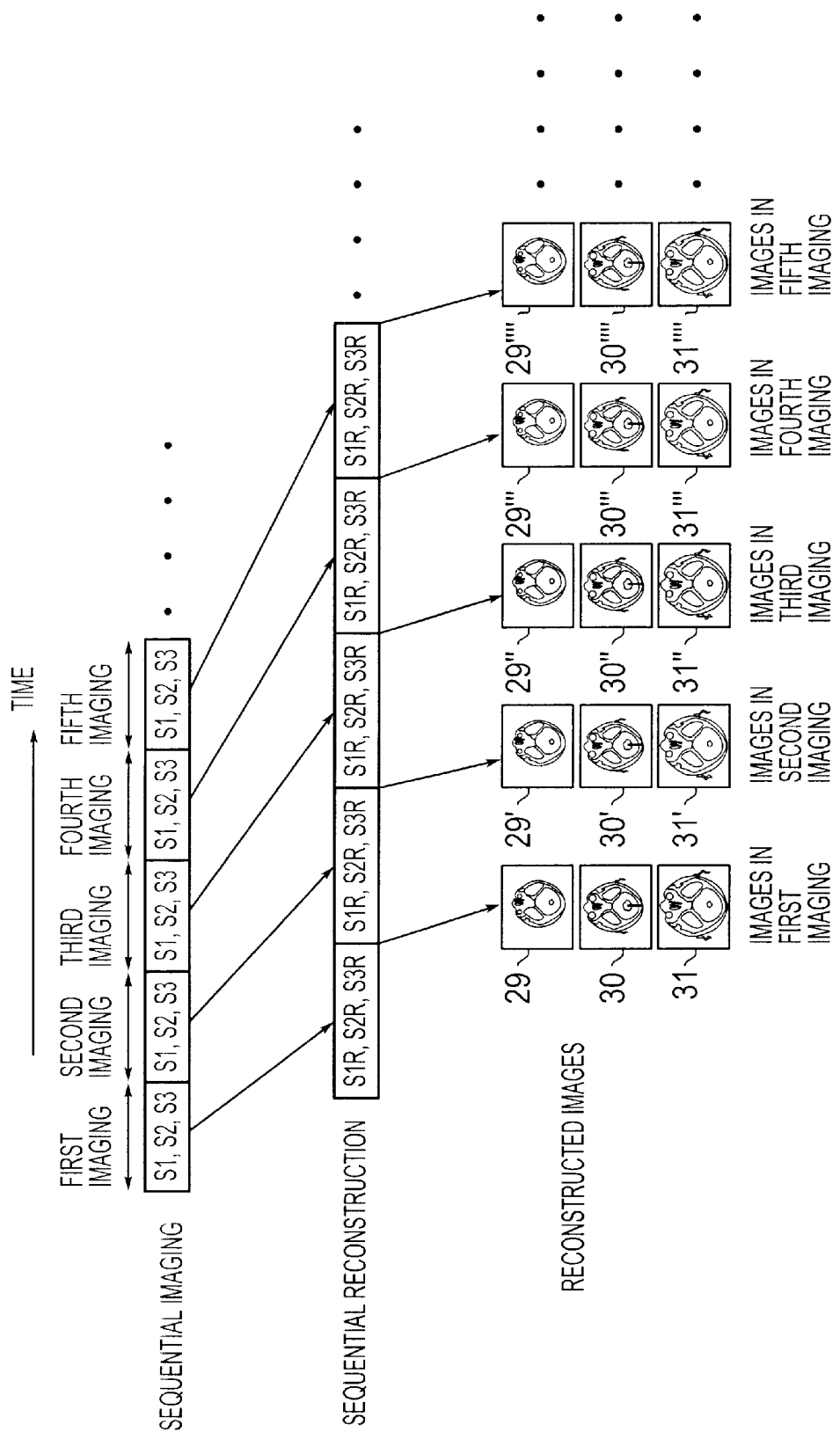
FIG. 2 is a view of an embodiment of the MR fluoroscopy according to the present invention.

FIG. 2 shows an embodiment of the MR fluoroscopy according to the present invention. In this embodiment, imaging, image reconstruction and display are performed sequentially and periodically with respect to parallel slices S1, S2 & S3 in the subject 9. The number of slices is not limited to three. In FIG. 2, an arrow indicates the passage of time.

Figure 3:
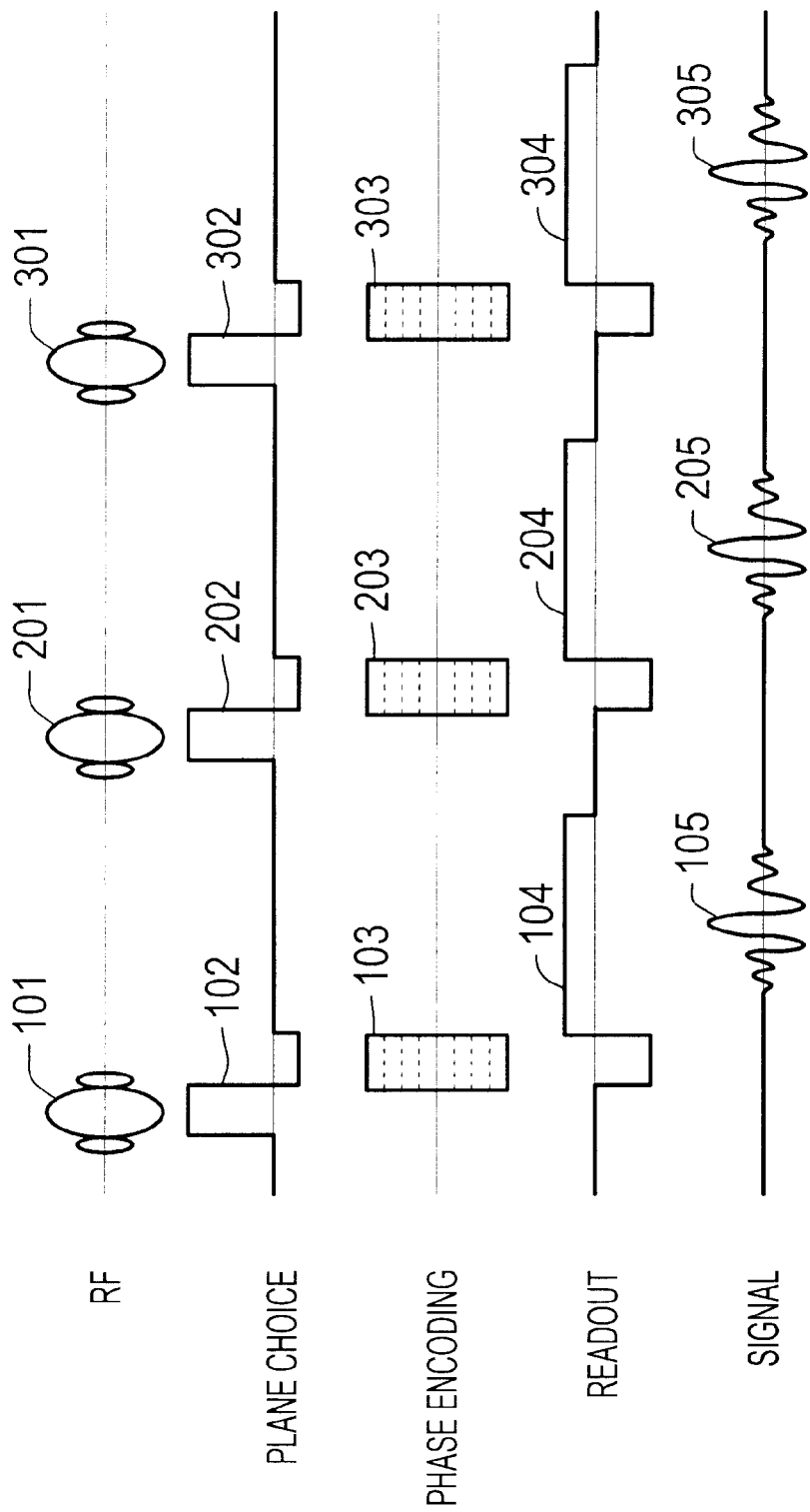
FIG. 3 is a view of an embodiment of an imaging sequence in the MR fluoroscopy according to the present invention.

In this embodiment, the imaging is performed in a pulse sequence as shown in FIG. 3 so as to execute an imaging sequence in the gradient echo method for slices. Specifically, an RF pulse 101 that excites the spins of the subject 9 and a slice selective gradient magnetic field pulse 102 that selects the slice S1 are applied to the subject 9 substantially at the same time so as to excite the spins within the slice S1 only. Then, a phase encoding gradient magnetic field pulse 103 is applied to the subject 9, and an inverted frequency encoding gradient magnetic field pulse 104 is applied to the subject 9 while an echo signal 105 is detected for a predetermined signal acquisition time.

A sequence is composed of the application of the RF pulse and the slice selective gradient magnetic field, the application of the phase encoding gradient magnetic field, and the application of the frequency encoding gradient magnetic field and the detection of the echo signal. The sequence is successively performed for the three slices S1, S2 & S3 by changing the frequency of the RF pulse to the RF pulses 101, 201 & 301. A unit is composed of these three sequences (the time required for one unit is a TR time). The unit is successively performed for a predetermined number of projections (e.g. 48) by changing the intensity of the phase encoding gradient magnetic field pulses 103, 203 & 303 to collect data required for reconstructing every image of the slices S1, S2 & S3. If the TR time is 50 msec, it is possible to collect data required for reconstructing the three images in 2.5 sec.

In the subsequent imaging sequences, the use of the data acquired in the previous imaging sequences with respect to several projections reduces the number of projections for detecting the signals and the imaging steps. Thus, time resolution of the image display is improved.

The signal processor 6 performs data processing (such as Fourier transformation, calculation of correction coefficients, and image reconstruction) S1R, S2R & S3R one after another for the slices S1, S2 & S3 to reconstruct images which reflect the distribution of spin intensity on each slice and display the images on the display 22 and the LCD 23 as tomographic images. The time required for reconstructing one image is adjusted by selecting the number of projections in the imaging step. During this period of time, the next imaging step is successively performed. The above-described successive imaging, image reconstruction and display make possible display of the reconstructed images in realtime.

In the MR fluoroscopy of the present invention, the slices S1, S2 & S3 can be imaged substantially at the same time, and it is therefore possible to acquire a set of images of slices substantially at the same time.

Figure 4:
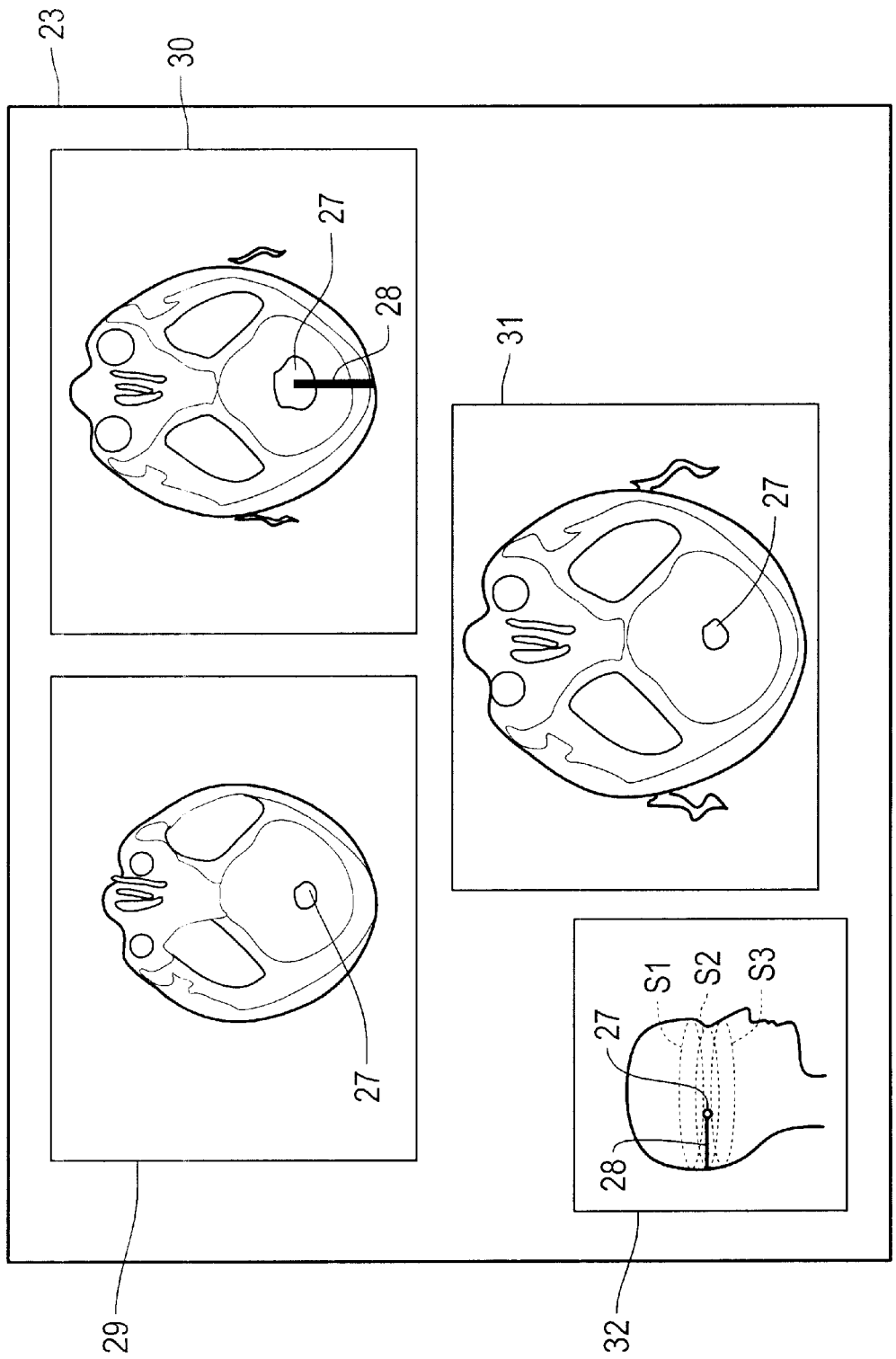
FIG. 4 is a view of an example of image display in the MR fluoroscopy in FIG. 2.

FIG. 4 shows an example wherein reconstructed images are shown on the LCD 23. The reconstructed images 29, 30 & 31 of the slices S1, S2 & S3, respectively, are shown on the LCD 23. The images 29, 30 & 31 are updated to images 29', 30' & 31' as soon as the images 29', 30' & 31' are reconstructed from subsequent collected data. They are further updated to images 29'', 30'' & 31'', . . .

If the nuclides subject to the MR imaging are protons, the needle 28 is displayed as shade on the image because the spin intensity distribution of the needle 28 is zero. In FIG. 4, the image 30 has shades of an affected part (e.g. a brain tumor) 27 in the subject's head and the needle 28.

On the LCD 23, there is also shown a guide image 32 that represents the positions of the slices S1, S2 & S3 in the subject. The guide image 32 shows the affected part 27 and the needle 28.

Accordingly, the operator can determine the position and advancing direction of the needle 28 three-dimensionally with reference to the realtime images 29, 30 & 31 on the LCD 23, which is placed in proximity to the subject. If the advancing direction of the needle 28 is displaced and the shade of the needle 28 disappears from the image of one slice during the insertion of the needle 28, the shade of the needle 28 appears on the image of another slice, and the operator can determine the position and advancing direction of the needle 28 with reference to the image. Thus, the operator can adjust the advancing direction of the needle 28, so that the needle 28 can reach the affected part 27.

Figure 5:
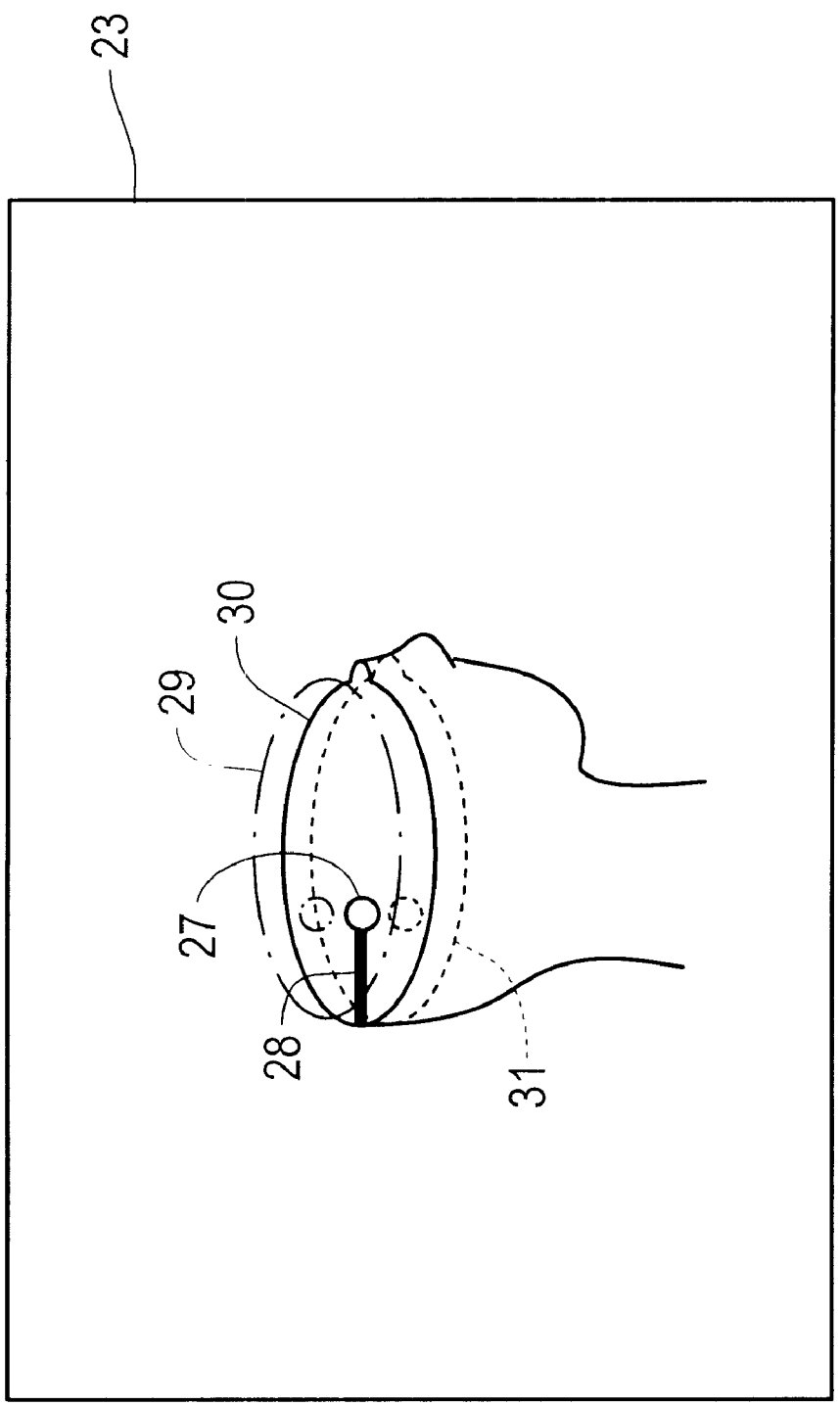
FIG. 5 is a view of another example of image display in the MR fluoroscopy in FIG. 2.

FIG. 4 shows the example wherein the images of three slices are displayed two-dimensionally, but it is also possible to combine and display them three-dimensionally as shown in FIG. 5. This makes it possible to display the position and advancing direction of the needle 28 more clearly. In this case, one of the slices is designated as the central slice (e.g. the slice that includes the target and is parallel with a direction in which the needle 28 should advance (an objective advancing direction)). The images of the other slices (the images 29 & 31 in FIG. 5) are displayed more palely than the image of the central slice (the image 30 in FIG. 5), or only the needle 28 is displayed on the images of the slices except for the central slice by finding each difference between the current image and the image that has been acquired before the puncture.

In the embodiment shown in FIG. 2, the MR fluoroscopy is performed for the parallel slices, but the present invention should not be restricted to this. The imaging, the image reconstruction and the image display may also be sequentially performed for slices that intersect each other (perpendicular for example), or slices that form a stereoscopic pair.

Figure 6:
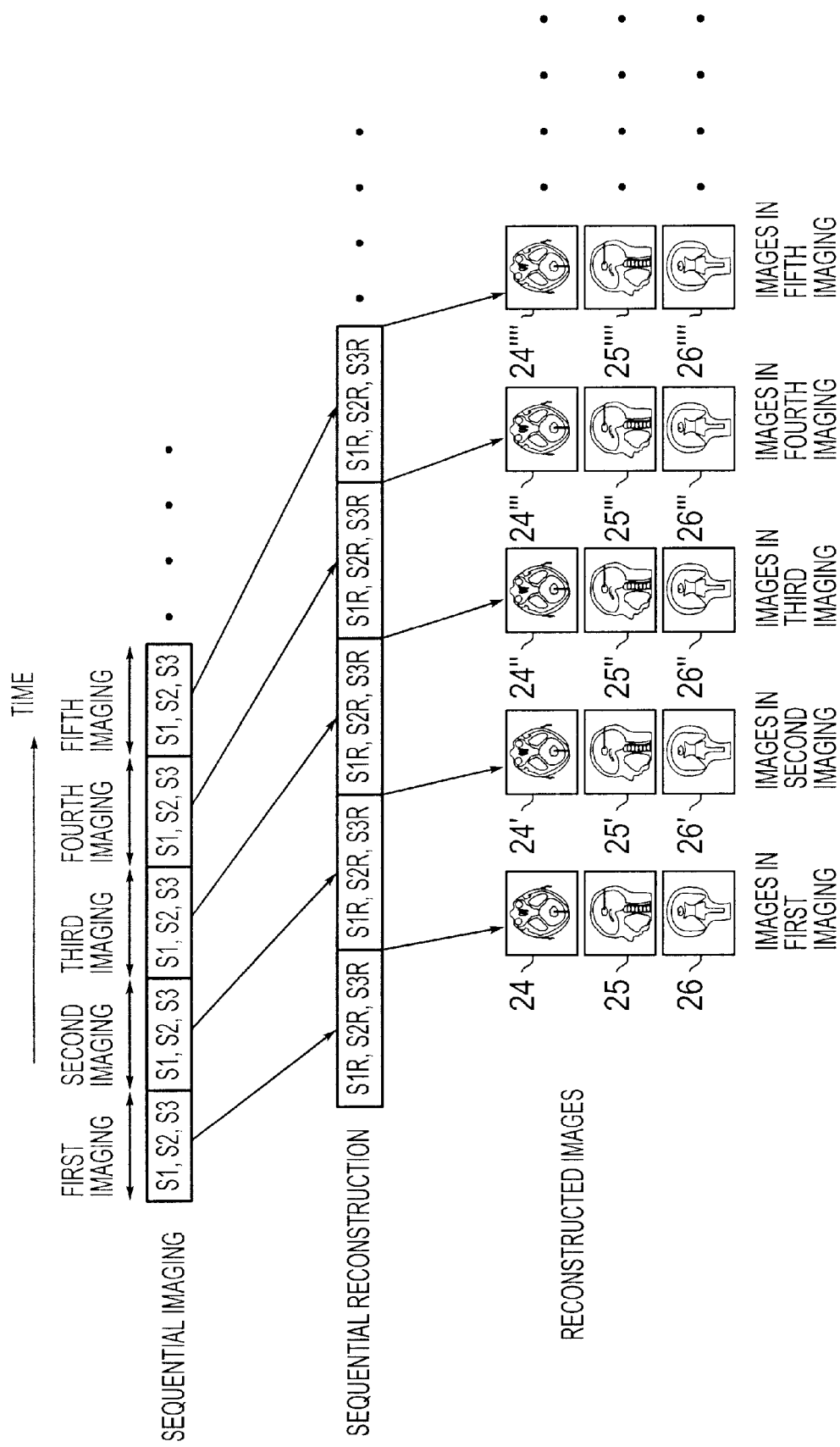
FIG. 6 is a view of another embodiment of the MR fluoroscopy according to the present invention.

FIG. 6 shows an example wherein the MR fluoroscopy of the present invention is performed for slices that are perpendicular to each other, for example, a transverse slice, a sagittal slice and a coronal slice. Reconstructed images 24, 25 & 26 are of the transverse, sagittal and coronal slices, respectively. If the axes of the slice selective gradient magnetic field pulses 102, 202 & 302, which are applied substantially simultaneously with the application of the RF pulses, are in the X-direction, Y-direction and Z-direction, respectively, the multi-slice imaging can be performed for the slices that are perpendicular to each other, or the transverse, sagittal and coronal slices. If the slices subject to excitation are perpendicular to each other as stated above, the gradient magnetic field (the phase encoding gradient magnetic field or the frequency encoding gradient magnetic field), which is applied at the time of imaging for a certain slice after the application of the RF pulse, effects the next imaging for another slice. The effects appear as shading in an area of the image of the latter slice, which intersects the former slice, and this necessitates correction for reducing the shading.

The time line and the relative position of the sequential imaging and sequential reconstruction lines of FIGS. 2 and 6 show that data acquisition for subsequent images is performed during the reconstruction of current images. They also show that reconstruction of a set of images is started before the completion of data acquisition for that set of images.

Figure 7:
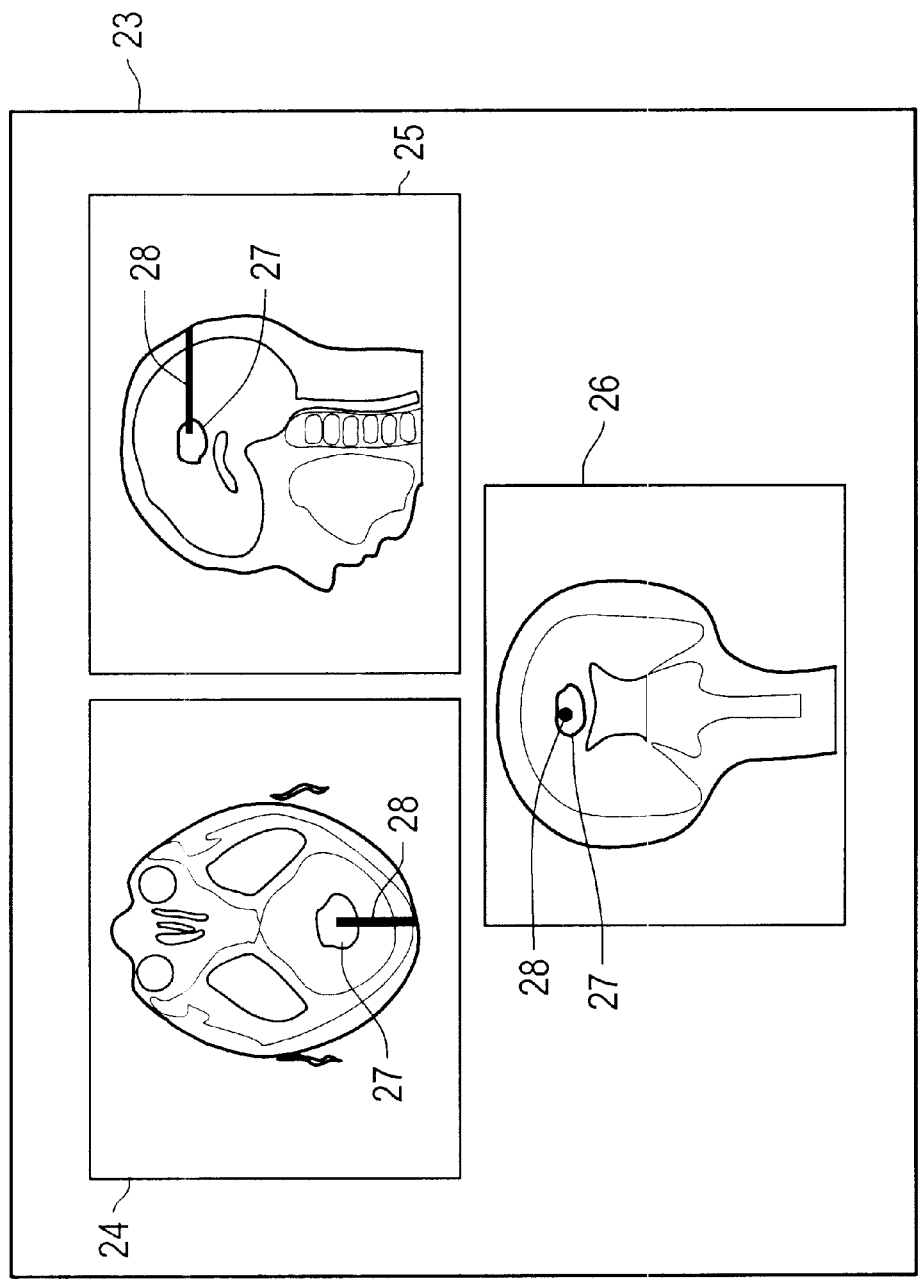
FIG. 7 is a view of an example of image display in the MR fluoroscopy in FIG. 6.
Figure 8:
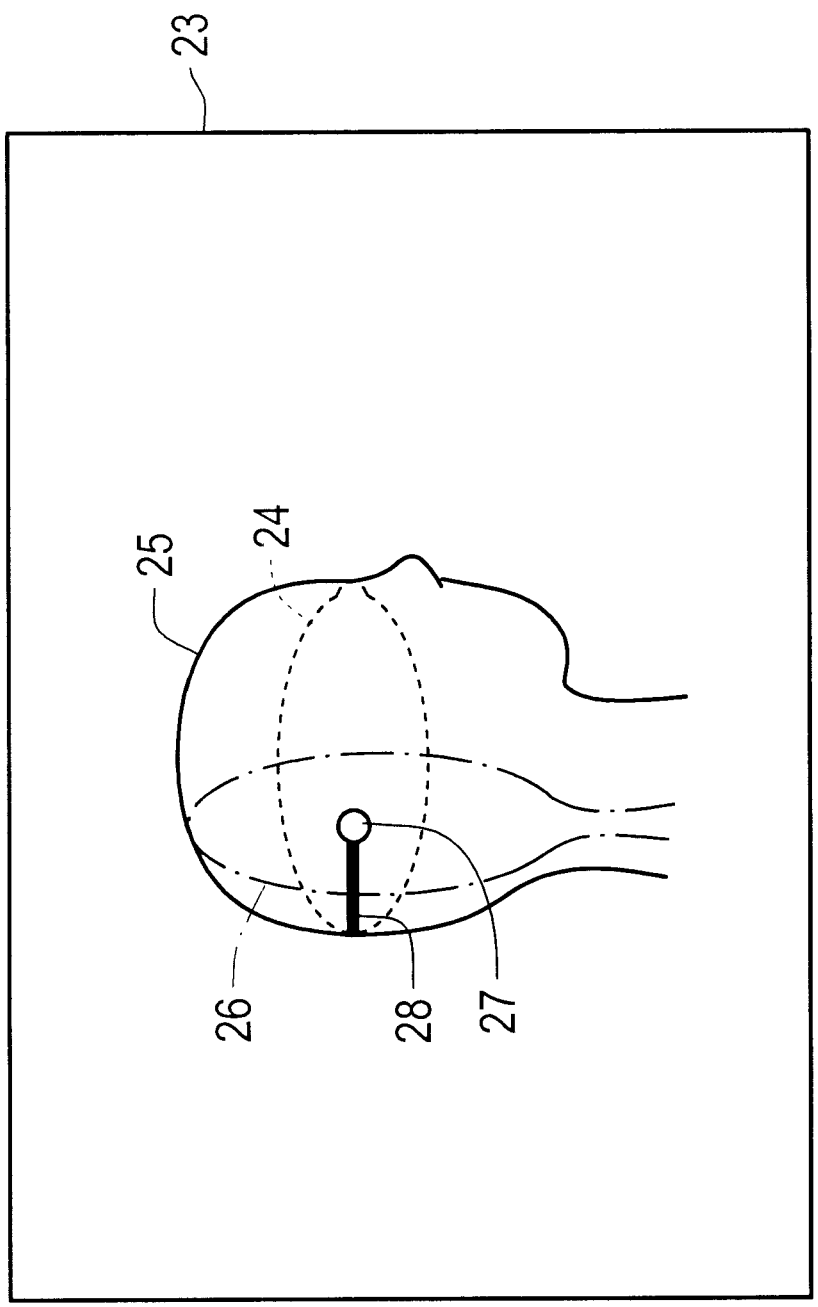
FIG. 8 is a view of another example of image display in the MR fluoroscopy in FIG. 6.

The reconstructed images 24, 25 & 26 of the slices may be displayed two-dimensionally as shown in FIG. 7. On the other hand, the images 24, 25 & 26 of the slices may be combined and displayed three-dimensionally as shown in FIG. 8. In this case, one of the slices is designated as the central slice (e.g. the slice that includes the target and is parallel with the objective advancing direction of the needle 28). The images of the other slices (the images 25 & 26 in FIG. 8) are displayed more palely than the image of the central slice (the image 24 in FIG. 8), or only the needle 28 is displayed on the images of the slices except for the central slice by finding each difference between the current image and the image that has been acquired before the puncture.

Figure 9:
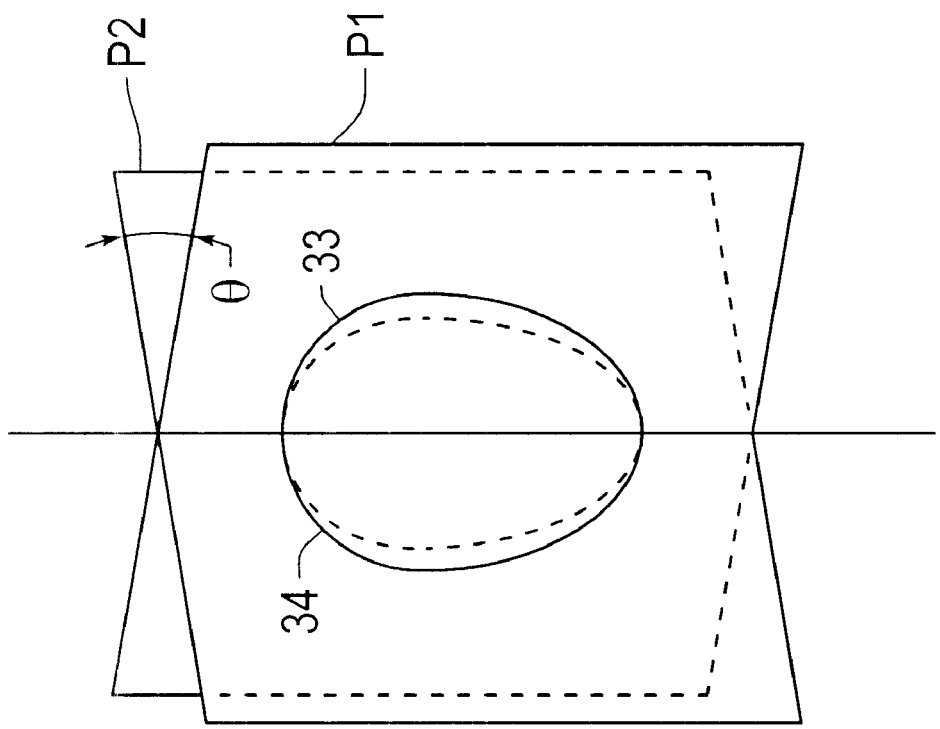
FIG. 9 is a view of an example of slices in the MR fluoroscopy according to the present invention.

Moreover, at least one of slices may be oblique. In this case, two slices can be selected so that the slices form a stereoscopic pair. FIG. 9 shows slices 33 & 34 forming the stereoscopic pair. The slice 33 is on a plane $P_1$, and the slice 34 is on a plane $P_2$. The slices 33 & 34 intersect each other at an angle θ (e.g. about 5° to about 7°). Tomographic images of the slices 33 & 34 are combined and displayed so that a stereoscopic image (a stereoscopic view) can be displayed. The stereoscopic view can be actualized in a variety of conventional methods. Examples of the conventional methods are a method of displaying the images of the slices forming the stereoscopic pair cyclically so as to display the images three-dimensionally due to afterimage phenomena, and a method of adding a perspective to the images of the slices forming the stereoscopic pair in computer graphics techniques and displaying the images. Hence, the position and advancing direction of the needle 28 can be displayed more clearly.

Figure 10:
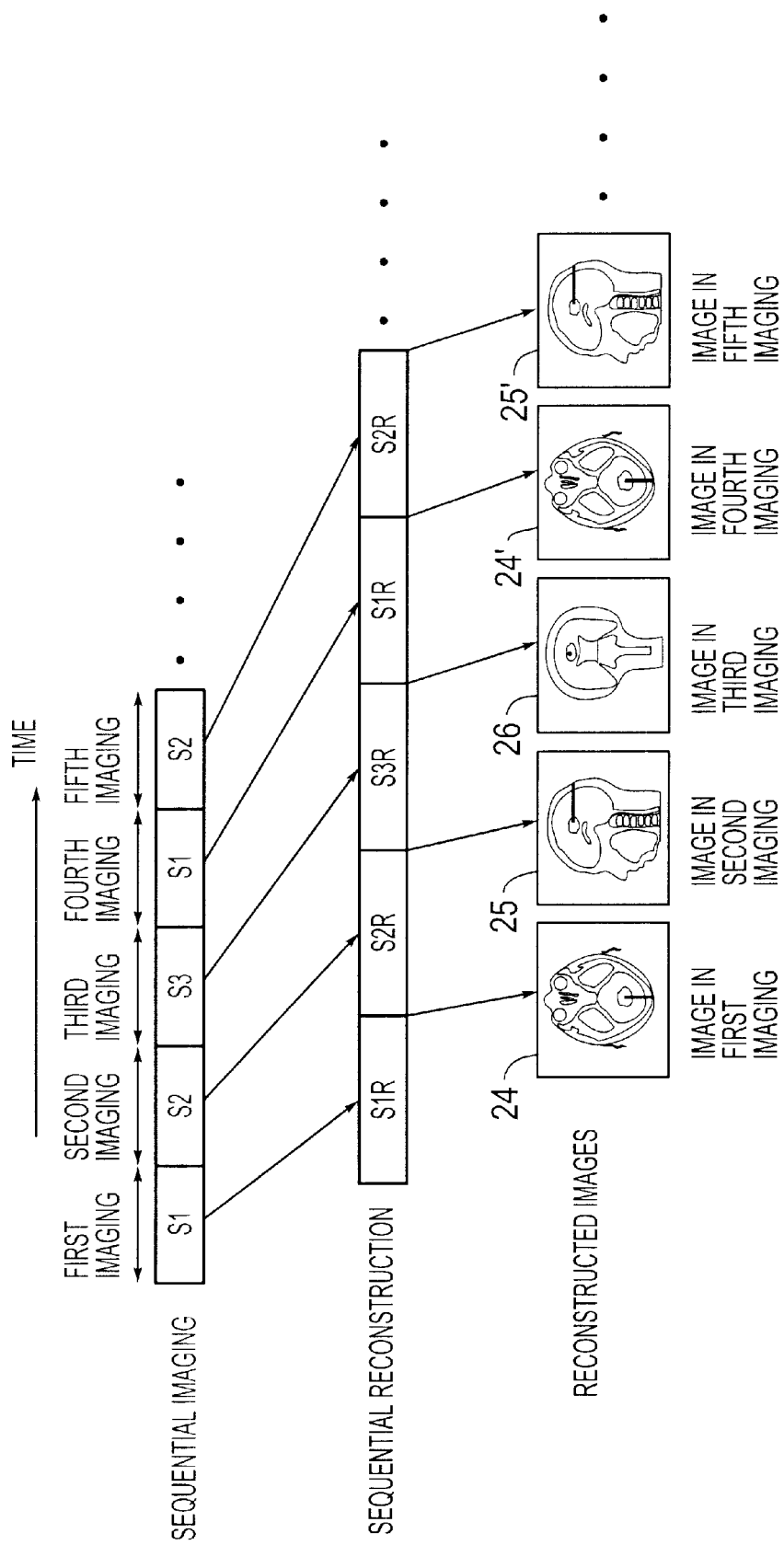
FIG. 10 is a view of another embodiment of an imaging sequence in the MR fluoroscopy according to the present invention.

In the above embodiments, the images are acquired by the multi-slice imaging, which reconstructs multiple images from the data acquired in one imaging, but the present invention should not be restricted to this. FIG. 10 shows an embodiment wherein images are acquired by single-slice imaging, which reconstructs single image from the data acquired in one imaging.

In this embodiment, the data of the slice S1 is acquired in the first imaging, and the data processing S1R is performed for the data to reconstruct the image 24 of the slice S1. Then, the data of the slice S2 is acquired in the second imaging, and the data processing S2R is performed for the data to reconstruct the image 25 of the slice S2. Likewise, the image 26 of the slice S3 is reconstructed. The above steps are repeated to reconstruct the images 24', 25', . . . .

In the above embodiments, every reconstructed image is shown on the same display as in FIGS. 4 and 7, but the present invention should not be restricted to this. A plurality of displays may be provided so that each of the displays shows at least one of the reconstructed images.

In the above embodiments, the gradient echo method is employed for the imaging sequence, but the present invention should not be restricted to this. Examples of the imaging sequence for acquiring signals required for image reconstruction of one slice in short time are the EPI method or the multi-shot EPI method, which repeatedly apply inverted frequency encoding gradient magnetic fields for one or more applications of the RF pulse to detect echo signals, and the burst sequence, which combines the RF pulses and 180° RF pulses to detect echo signals in the same number as the RF pulses.

As set forth hereinabove, the MR imaging system of the present invention repeats the imaging, image reconstruction and display for slices to thereby display realtime images of the imaged slices substantially at the same time. The acquired sequential images are shown on the display which is placed in proximity to the subject so that the operator, who is performing the IVR etc., can always determine the position and advancing direction of the IVR means such as the needle for puncture, biopsy, etc. and the catheter which is inserted into the subject. This facilitates the IVR using the MR imaging system.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A magnetic resonance fluoroscopic imaging apparatus, comprising:

a static magnetic field generator which generates a static magnetic field;

a radio frequency magnetic field generator which generates a radio frequency magnetic field to excite nuclei in a plurality of slices of a subject placed within the static magnetic field;

a gradient magnetic field generator which generates a slice direction gradient magnetic field, a phase encoding gradient magnetic field and a frequency encoding gradient magnetic field;

a signal detector which detects nuclear magnetic resonance signals emitted from the nuclei;

a signal processor which reconstructs images of the plurality of slices from the nuclear magnetic resonance signals;

a display which displays the images as soon as they are reconstructed; and a controller which controls the radio frequency magnetic field generator, the gradient magnetic field generator and the signal processor, the controller performing an imaging process to sequentially image the plurality of slices by exciting the nuclei, by detecting the nuclear magnetic resonance signals and by reconstructing images of the plurality of slices, the controller successively repeating the imaging process to acquire a plurality of successive images of each of the plurality of slices, the controller successively displaying, on the display, sets of the images of the plurality of slices substantially simultaneously acquired, wherein the controller reconstructs the images while generating and detecting subsequent magnetic resonance signals for reconstruction of subsequent images of the plurality of slices, and at least one of the plurality of slices includes a position where an insertion is inserted in the subject and the at least one of the plurality of slices is parallel with an intended advancing direction of the insertion.

2. The magnetic resonance fluoroscopic imaging apparatus as defined in claim 1, wherein the plurality of slices are parallel with the intended advancing direction of the insertion.

3. The magnetic resonance fluoroscopic imaging apparatus as defined in claim 1, wherein the at least one of the plurality of slices is parallel with the intended advancing direction of the insertion; and another of the plurality of slices intersects the at least one of the plurality of slices.

4. The magnetic resonance fluoroscopic imaging apparatus as defined in claim 1, wherein two of the plurality of slices form a stereoscopic pair.

5. A magnetic resonance fluoroscopic imaging method, comprising sequential steps of:

(a) placing a subject in a static magnetic field;

(b) applying a slice direction gradient magnetic field and a radio frequency magnetic field to the subject to excite nuclei in one of a plurality of slices of the subject;

(c) applying a phase encoding gradient magnetic field to phase-encode the nuclei excited in the step (b);

(d) applying a frequency encoding gradient magnetic field and detecting nuclear magnetic resonance signals emitted from the nuclei;

(e) repeating the steps (b)–(d) until the nuclear magnetic resonance signals required for imaging the plurality of slices are acquired;

(f) reconstructing images of the plurality of slices from the nuclear magnetic resonance signals acquired in the step (e);

(g) simultaneously displaying, on a display, the images of the plurality of slices reconstructed in the step (f); and (h) repeating the steps (e)–(g) a plurality of times successively, wherein, during reconstruction of prior images of the plurality of slices, the step (e) is successively repeated during the reconstruction to acquire subsequent nuclear magnetic resonance signals for reconstruction of subsequent images of the plurality of slices, wherein at least one of the plurality of slices includes a position where an insertion is inserted in the subject.

6. The magnetic resonance fluoroscopic imaging method as defined in claim 5, wherein the step (e) is performed within a predetermined repetition time.

7. The magnetic resonance fluoroscopic imaging method as defined in claim 5, wherein the plurality of slices are parallel with an intended advancing direction of the insertion.

8. The magnetic resonance fluoroscopic imaging method as defined in claim 5, wherein the at least one of the plurality of slices is parallel with an intended advancing direction of the insertion; and another of the plurality of slices intersects the at least one of the plurality of slices.

9. The magnetic resonance fluoroscopic imaging method as defined in claim 5, wherein two of the plurality of slices form a stereoscopic pair.

10. A magnetic resonance fluoroscopic imaging method, comprising sequential steps of:

(a) placing a subject in a static magnetic field;

(b) applying a slice direction gradient magnetic field and a radio frequency magnetic field to the subject to excite nuclei in one of a plurality of slices of the subject parallel with an intended advancing direction of an insertion inserted in the subject;

(c) applying a phase encoding gradient magnetic field to phase-encode the nuclei excited in the step (b);

(d) applying a frequency encoding gradient magnetic field and detecting nuclear magnetic resonance signals emitted from the nuclei;

(e) repeating the steps (b)–(d) until the nuclear magnetic resonance signals required for imaging the plurality of slices are acquired;

(f) reconstructing images of the plurality of slices from the nuclear magnetic resonance signals acquired in the step (e);

(g) simultaneously display, on a display, the images of the plurality of slices reconstructed in the step (f); and (h) repeating the steps (e)–(g) a plurality of times successively, wherein, during reconstruction of prior images of the plurality of slices, the step (e) is successively repeated during the reconstruction to acquire subsequent nuclear magnetic resonance signals for reconstruction of subsequent images of the plurality of slices.

11. The magnetic resonance fluoroscopic imaging method as defined in claim 10, wherein the step (e) is performed within a predetermined repetition time.

12. A magnetic resonance fluoroscopic imaging apparatus, comprising:

a static magnetic field generator which generates a static magnetic field;

a radio frequency magnetic field generator which generates a radio frequency magnetic field to excite nuclei in a plurality of slices of a subject placed within the static magnetic field;

a gradient magnetic field generator which generates a slice direction gradient magnetic field, a phase encoding gradient magnetic field and a frequency encoding gradient magnetic field;

a signal detector which detects nuclear magnetic resonance signals emitted from the nuclei;

a signal processor which reconstructs images of the plurality of slices from the nuclear magnetic resonance signals;

a display which displays the images as soon as they are reconstructed; and a controller which controls the radio frequency magnetic field generator, the gradient magnetic field generator and the signal processor, the controller performing an imaging process to sequentially image the plurality of slices by exciting the nuclei, by detecting the nuclear magnetic resonance signals and by reconstructing images of the plurality of slices, the plurality of slices being parallel with an intended advancing direction of an insertion inserted in the subject, the controller successively repeating the imaging process to acquire a plurality of successive images of each of the plurality of slices, the controller successively displaying, on the display, sets of the images of the plurality of slices substantially simultaneously acquired, wherein the controller reconstructs the images while generating and detecting subsequent magnetic resonance signals for reconstruction of subsequent images of the plurality of slices, and the controller during reconstruction of prior images of the plurality of slices successively repeats the imaging of the plurality of slices to acquire subsequent nuclear magnetic resonance signals for reconstruction of subsequent images of the plurality of slices.

* * * * *